US009376576B2

(12) United States Patent
Jung et al.

(10) Patent No.: US 9,376,576 B2
(45) Date of Patent: Jun. 28, 2016

(54) RESIN COMPOSITION FOR A SURFACE TREATMENT, AND STEEL SHEET COATED WITH SAME

(75) Inventors: Yong-Gyun Jung, Gwangyang-si (KR); Gab-Yong Kim, Incheon (KR); Woon-Jong Kim, Ansan-si (KR); Jae-Dong Cho, Incheon (KR); Jong-Sang Kim, Gwangyang-si (KR); Joong-Kyu Kim, Seoul (KR); Myoung-Hee Choi, Anyang-si (KR); Yon-Kyun Song, Gwangyang-si (KR)

(73) Assignees: POSCO, Pohang-si (KR); Noroo Coil Coatings, Co., Ltd., Pohang-si (KR)

( * ) Notice: Subject to any disclaimer, the term of this patent is extended or adjusted under 35 U.S.C. 154(b) by 257 days.

(21) Appl. No.: 14/232,014

(22) PCT Filed: Jul. 13, 2012

(86) PCT No.: PCT/KR2012/005587
§ 371 (c)(1),
(2), (4) Date: Jan. 10, 2014

(87) PCT Pub. No.: WO2013/009133
PCT Pub. Date: Jan. 17, 2013

(65) Prior Publication Data
US 2014/0147645 A1    May 29, 2014

(30) Foreign Application Priority Data

Jul. 13, 2011 (KR) .................. 10-2011-0069491

(51) Int. Cl.
| B32B 7/02 | (2006.01) |
| C09D 5/24 | (2006.01) |
| C09D 7/12 | (2006.01) |
| H01L 23/373 | (2006.01) |

(52) U.S. Cl.
CPC ............... *C09D 5/24* (2013.01); *C09D 7/1216* (2013.01); *C09D 7/1275* (2013.01); *C09D 7/1283* (2013.01); *H01L 23/3737* (2013.01); *H01L 23/373* (2013.01); *H01L 23/3735* (2013.01); *H01L 23/3738* (2013.01); *H01L 2924/0002* (2013.01); *Y10T 428/24975* (2015.01); *Y10T 428/25* (2015.01); *Y10T 428/256* (2015.01); *Y10T 428/259* (2015.01); *Y10T 428/265* (2015.01); *Y10T 428/31529* (2015.04); *Y10T 428/31605* (2015.04)

(58) Field of Classification Search
CPC .......... C09D 201/00; C09D 5/24; C09D 7/12; C09D 7/1216; C09D 7/1275; C09D 7/1283; Y10T 428/24975; Y10T 428/25; Y10T 428/256; Y10T 428/259; Y10T 428/265; Y10T 428/31529; Y10T 428/31605
USPC ....................................................... 428/212
See application file for complete search history.

(56) References Cited

U.S. PATENT DOCUMENTS

| 5,202,753 | A | 4/1993 | Shintai | |
| 2007/0036900 | A1* | 2/2007 | Liu | .................. B05D 5/08 427/372.2 |
| 2010/0243949 | A1 | 9/2010 | Wang et al. | |
| 2011/0077337 | A1 | 3/2011 | Yeh et al. | |

FOREIGN PATENT DOCUMENTS

| CN | 101037341 A | 9/2007 |
| CN | 101654778 A | 2/2010 |
| EP | 2397455 A1 | 12/2011 |
| GB | 2078688 A | 1/1982 |
| JP | 61281879 | 12/1986 |
| JP | 1997-183610 A | 7/1997 |
| JP | 2000-353772 A | 12/2000 |
| JP | 2001139725 | 5/2001 |
| JP | 2008-502815 A | 1/2008 |
| JP | 2010-248626 A | 11/2010 |
| KR | 10-2005-0028912 A | 3/2005 |
| KR | 10-0926064 B1 | 11/2009 |
| KR | 10-2010-0112425 A | 10/2010 |
| KR | 10-1035011 B1 | 5/2011 |
| WO | 2005/105432 A1 | 11/2005 |
| WO | 2006001943 A2 | 1/2006 |
| WO | 2010092923 A1 | 8/2010 |

OTHER PUBLICATIONS

Database WPI, Week 198704, Thomson Scientific, London, GB, AN 1987-025660, XP002741421.
Database CA, Chemical Abstracts Service, Columbus, OH, US, Sep. 21, 2007, Zhang, Xuesong et al., "Nonoxides in composite magnesia-carbon brick with low carbon content and thermal conductivity and good resistance to slags and thermal shock", XP002741422, retrieved from STN Database accession No. 2007:1064900.
Database CA, Chemical Abstracts Service, Columbus, Ohio, US, Mar. 2, 2010, Zhang, Ting et al., "Method for preparing electrically insulating thermally conductive ceramic coating from polymer precursor", XP002741423, retrieved from STN Database accession No. 2010:258248.
Database WPI, Week 200156, Thomson Scientific, London, GB, AN 2001-505539, XP002741424.

* cited by examiner

*Primary Examiner* — Bijan Ahvazi
*Assistant Examiner* — Lawrence Ferguson
(74) *Attorney, Agent, or Firm* — The Webb Law Firm

(57) ABSTRACT

Provided are a resin composition for surface treatment and a surface-treated steel sheet coated therewith. The resin composition for surface treatment includes a dispersing element having excellent thermal conductivity and heat dissipation, thereby maintaining physical properties of the conventional anti-fingerprint steel sheet, for example, high whiteness, fingerprint resistance, workability, electric conductivity and alkali resistance, and providing heat dissipation. In addition, the surface-treated steel sheet coated with the resin composition for surface treatment of the present invention has physical properties such as high heat dissipation, electric conductivity and whiteness, and thus may be replaced with a bottom chassis of a backlight unit, particularly, an edge-type backlight unit.

3 Claims, 2 Drawing Sheets

RESIN COMPOSITION FOR A SURFACE TREATMENT, AND STEEL SHEET COATED WITH SAME

CROSS-REFERENCE TO RELATED APPLICATIONS

This application is the United States national phase of International Application No. PCT/KR2012/005587 filed Jul. 13, 2012, and claims priority to Korean Patent Application No. 10-2011-0069491 filed Jul. 13, 2011, the disclosures of which are hereby incorporated in their entirety by reference.

TECHNICAL FIELD

The present invention relates to a resin composition for surface treatment and a steel sheet coated therewith.

BACKGROUND ART

Recently, a light source used in a thin film-type LCD TV is rapidly replaced by a light emitting diode (LED) having excellent energy efficiency and color expression in a conventional cold cathode fluorescent lamp (CCFL). The LED has various advantages such as high light conversion efficiency with respect to conventional CCFL (CCFL: 40%, LED maximum 90%), no mercury (environmentally-friendly), a fast response speed (60 nano seconds), a small size, and a long life span (50,000 to 100,000 hrs), it is widely used as a light source of a thin film-type TV.

However, one thing that is considered by related companies to mount an LED on a thin film-type TV is dissipation of heat generated from an LED chip. Recently, light emitting efficiency of the LED increases, but a heating value of the LED chip is on a considerable level, and thus if a suitable solution for heat dissipation is not found, a temperature of the LED chip increases too high, the LED chip itself or a packaging resin is degraded, and degradation of light emitting efficiency and decrease in lifespan of the LED chip are caused. Accordingly, to maintain a long life, which is the greatest advantage of the LED, it is essential to develop technology of heat dissipation for effectively dispersing heat generated from the LED chip.

To this end, various methods of increasing heat dissipating efficiency of the LED are discussed, but endeavor to reduce heat generated from the LED as much as possible by adding heat dissipation to a bottom chassis of a backlight unit (BLU) to which the LED chip is attached is accompanied. Particularly, ideas of the heat dissipation technology are also changed by which part of the bottom chassis has an LED lamp.

The LED backlight unit is broadly divided into a direct lighting type and an edge lighting type. The direct lighting-type backlight unit has LED lamps on a back side of a display which is seen by a person, and thus the LED lamps are evenly dispersed on an entire surface of the bottom chassis. Due to such a structural characteristics, in the direct lighting-type backlight unit, heat emitted from the LED is uniformly dispersed on the entire surface of the bottom chassis without being locally concentrated, and thus sufficient heat dissipation performance may be ensured only with an electro galvanizing (EG) anti-fingerprint steel sheet which is applied to a common LCD TV. However, the edge-type backlight unit is applied to high power LED and decreased in life span of a direct-circuit LED light source, and heat generated from the LED chip is concentrated on a side surface of the TV, thereby occurring thermal deformation of the bottom chassis. Now, as a method to solve this, application of an aluminum panel having excellent thermal conductivity as a material for the bottom chassis of a backlight unit, particularly, the edge-type backlight unit, or attachment of a heat dissipating pad and coating of a heat dissipating paint are performed.

Generally, since a thermal conductivity of aluminum is 200 W/m·K, which is more than or equal to double the thermal conductivity of steel, 80 W/m·K, local heat generated from the LED chip of the edge-type backlight unit is rapidly transferred to the entire bottom chassis, resulting in thermal balance. However, when the bottom chassis is applied as the aluminum panel, it consumes a part cost more than or equal to double the conventional material, an electro galvanizing anti-fingerprint steel sheet, and the aluminum panel is entirely dependent on imports. Therefore, as its use increases, due to the problem of supply of a raw material, the price may further increase. In addition, aluminum has a heat dissipation rate of approximately 0.02 to 0.25 according to a degree of alloy, and thus performance of emitting heat to an outside is considerably decreased, and workability is lower than that of steel, resulting in a high defect rate of 30% or more in a part processing process. Thus, the aluminum has several problems on aspects of physic properties such as corrosion resistance, workability and fingerprint resistance.

Meanwhile, since the general electro galvanizing anti-fingerprint steel sheet has a thermal conductivity of 60 to 65 W/m·K, which is very lower than the aluminum alloy plate having a thermal conductivity of 130 to 168 W/m·K, heat generated from the LED chip of an edge-type backlight unit has a limit to transfer heat to another part of the bottom chassis.

To solve the above-described problems, development of a resin composition for surface treatment which can maintain conventional fingerprint resistance and other physical properties, and enhance heat dissipation is eagerly demanded.

SUMMARY OF THE INVENTION

The present invention is directed to providing a resin composition for surface treatment having excellent heat dissipation, electric conductivity and whiteness, a steel sheet coated with the resin composition for surface treatment, a method of manufacturing the steel sheet, and a bottom chassis for a flat panel device including the steel sheet.

In one aspect, a resin composition for surface treatment includes an organic resin and a thermally conductive dispersing element including 35 to 65 parts by weight of a silicon-containing compound and 35 to 65 parts by weight of an aluminum-containing compound with respect to 100 parts by weight of a solid content of the thermally conductive dispersing element.

In another aspect, a surface-treated steel sheet includes a steel sheet and a surface-treated layer formed on one or both surfaces of the steel sheet and containing a cured material of the resin composition for surface treatment according to the present invention.

According to the present invention, a resin composition for surface treatment includes a dispersing element having excellent thermal conductivity and heat dissipation, which can maintain physical properties having a conventional anti-fingerprint steel sheet, for example, high whiteness, corrosion resistance, fingerprint resistance, workability, electric conductivity and alkali resistance, and provide excellent heat dissipation.

DESCRIPTION OF THE INVENTION

Figure 1:
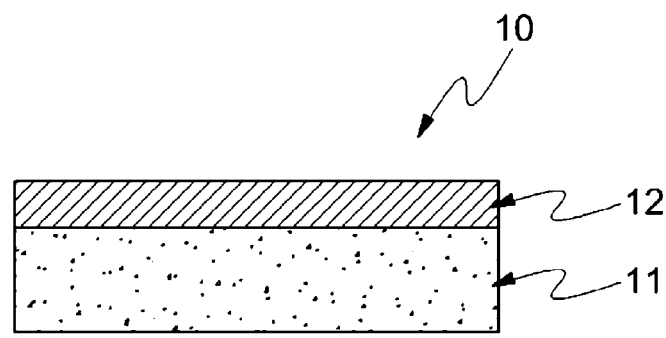
FIG. 1 is a cross-sectional view of a surface-treated steel sheet according to an exemplary embodiment of the present invention.

Hereinafter, exemplary embodiments of the present invention will be described in detail. However, the present invention is not limited to the embodiments disclosed below, but may be implemented in various forms. The following embodiments are described in order to enable those of ordinary skill in the related art to embody and practice the present invention.

The present invention relates to a resin composition for surface treatment, which includes an organic resin, and a thermally conductive dispersing element including 35 to 65 parts by weight of a silicon-containing compound and 35 to 65 parts by weight of an aluminum-containing compound with respect to 100 parts by weight of a solid content of the thermally conductive dispersing element.

Hereinafter, the resin composition for surface treatment of the present invention will be described in detail.

The resin composition for surface treatment of the present invention includes an organic resin and a thermally conductive dispersing element. A base to which the resin composition for surface treatment of the present invention is applied is not particularly limited, and for example, may be a metal, wood, or plastic, and preferably, the base may be applied in surface treatment of a metal.

In the composition of the present invention, the thermally conductive dispersing element includes 35 to 65 parts by weight of a silicon-containing compound and 35 to 65 parts by weight of an aluminum-containing compound with respect to 100 parts by weight of a solid content of the thermally conductive dispersing element. The thermally conductive dispersing element may include a material having excellent thermal conductivity and heat radiation, thereby enhancing heat dissipation of the steel sheet when the steel sheet is coated with the resin composition for surface treatment of the present invention.

The units "parts by weight" used herein refer to a weight ratio.

When a content of the silicon-containing compound in the thermally conductive dispersing element of the composition according to the present invention is less than 35 parts by weight, heat dissipation may be degraded, and the content of the silicon-containing compound in the thermally conductive dispersing element of the composition according to the present invention is more than 65 parts by weight, the heat dissipation may not be further enhanced, and solution stability may be degraded.

In addition, when a content of the aluminum-containing compound is less than 35 parts by weight, heat dissipation and electric conductivity may be degraded, and when the content thereof is more than 65 parts by weight, heat dissipation may not be further enhanced, and solution stability and curability may be degraded.

In the composition of the present invention, an average particle diameter of the silicon-containing compound may be, but is not particularly limited to, 5 μm or less, and preferably 2 μm or less. When the average particle diameter of the silicon-containing compound is more than 5 μm, solution stability may be degraded due to rapid precipitation of the silicon-containing compound, and physical properties of a thin film coating may be degraded. The lower limit of the average particle diameter of the silicon-containing compound may be, but is not particularly limited to, 0.05 μm or more, and preferably 0.1 μm or more.

In addition, in the composition of the present invention, the specific kind of the silicon-containing compound is not particularly limited, but may be at least one selected from the group consisting of silicon (Si), silicon carbide (SiC) and silicon nitride ($Si_3N_4$), which has excellent thermal conductivity.

In the composition of the present invention, the average particle diameter of the aluminum-containing compound may be, but is not particularly limited to, 3 μm or less, and preferably 1 μm or less. When the average particle diameter of the aluminum-containing compound is more than 3 μm, effects caused by the particle size may not be obtained, and thus the heat dissipation and solution stability may be degraded. In addition, the lower limit of the average particle diameter of the aluminum-containing compound may be, but is not particularly limited to, 0.01 μm or more, and preferably, 0.1 μm or more.

In addition, in the composition of the present invention, the specific kind of the aluminum-containing compound is not particularly limited, but may be at least one selected from the group consisting of aluminum oxide, aluminum nitride (AlN), and aluminum powder, which have excellent thermal conductivity.

In the composition of the present invention, the thermally conductive dispersing element may further include 10 parts by weight or less of a carbon-containing compound with respect to 100 parts by weight of a solid content of the thermally conductive dispersing element. The thermally conductive dispersing element may further include a carbon-containing compound, thereby further enhancing thermal conductivity, heat radiation and electric conductivity of the composition of the present invention. However, when the content of the carbon-containing compound is more than 10 parts by weight, the electric conductivity may not be further enhanced, and its color becomes darker, thereby degrading designability. The lower limit of the content of the carbon-containing compound may be, but is not particularly limited to, 0.1 parts by weight or more, and preferably in part by weight or more.

In the composition of the present invention, an average particle diameter or a length of the major axis of the carbon-containing compound may be, but is not particularly limited to, 5 μm or less, and preferably 3 μm or less. When the average particle diameter or length of the major axis of the carbon-containing compound is more than 5 μm, the physical properties of the thin film coating may be degraded. In addition, the lower limit of the average particle diameter or length of the major axis of the carbon-containing compound may be, but is not particularly limited to, 0.05 μm or more, and preferably 0.1 μm or more.

In addition, in the composition of the present invention, a specific kind of the carbon-containing compound may be, but is not particularly limited to, at least one selected from the group consisting of a carbon nanotube, a carbon fiber, a carbon black, a graphite and a graphene, which have excellent thermal conductivity.

In the composition of the present invention, the thermally conductive dispersing element may further include a compound having a far infra-red radiation ratio in a wavelength range from 5 to 20 μm of 0.8 or more of 10 parts by weight or less with respect to 100 parts by weight of the solid content of the thermally conductive dispersing element. The thermally conductive dispersing element may further include a compound having a far infrared radiation ratio of 0.8 or more, thereby further enhancing thermal conductivity and heat radiation of the composition of the present invention. However, when a content of the compound of the far infrared radiation ratio of 0.8 or more is more than 10 parts by weight, heat dissipation may not be further enhanced, and solution stability may be degraded. The lower limit of the content of the compound having a far infrared radiation ratio of 0.8 or more may be, but is not particularly limited to, 0.1 parts by weight or more, and preferably 1 part by weight or more.

In the composition of the present invention, an average particle diameter of the compound having a far infrared radiation ratio of 0.8 or more in the wavelength range of 5 to 20 μm may be, but is not particularly limited to, 5 μm or less, and preferably 2 μm or less. When the average particle diameter of the compound having a far infrared radiation ratio of 0.8 or more is more than 5 μm, the solution stability may be degraded, and physical properties of the thin film coating may be degraded. In addition, the lower limit of the average particle diameter of the compound having a far infrared radiation ratio of 0.8 or more is not particularly limited, but may be 0.05 μm or more, and preferably 0.1 μm or more.

In addition, in the composition of the present invention, a specific kind of the compound having a far infrared radiation ratio of 0.8 or more in the wavelength range of 5 to 20 μm may be, but is not particularly limited to, at least one selected from the group consisting of magnesium (Mg), magnesium oxide (MgO), titanium dioxide ($TiO_2$), sericite, mica, tourmaline, biotite, illite, kaolin, bentonite, quartz porphyry, gneisses, ceramic powder, germanium (Ge), germanium dioxide ($GeO_2$) and germanium 132 (Ge-132), and preferably, at least one selected from the group consisting of magnesium oxide (MgO), mica, kaolin and Ge.

In the composition of the present invention, the thermally conductive dispersing element may further include a dispersion resin. The dispersion resin may be used as a dispersion solvent dispersing materials having excellent thermal conductivity and heat radiation such as a silicon-containing compound, an aluminum-containing compound, a carbon-containing compound and the compound having a far infrared radiation ratio of 0.8 or more.

That is, as the above-described materials having excellent thermal conductivity and heat radiation are dispersed in the dispersion resin, a thermally conductive dispersing element may be prepared. A method of dispersing the materials having excellent thermal conductivity and heat radiation is not particularly limited, and a means generally used in the art, for example, dyno-mill or ring mill, may be used without limitation.

In the composition of the present invention, a specific kind of the dispersion resin included in the thermally conductive dispersing element is not particularly limited, any organic resin capable of well dispersing the above-described materials having excellent thermal conductivity and heat radiation may be used without limitation. In the composition of the present invention, as an example of the dispersion resin, at least one selected from the group consisting of a waterborne urethane resin, a waterborne acryl resin, a water-soluble epoxy resin, a water-soluble polyester resin, a water-soluble amino resin and a mixture thereof, and preferably, a waterborne urethane resin, but the present invention is not limited thereto.

In the composition of the present invention, the thermally conductive dispersing element may include the dispersion resin at 20 to 80 parts by weight, and preferably 40 to 60 parts by weight, with respect to 100 parts by weight of the solid content of the thermally conductive dispersing element. When the content of the dispersion resin is less than 20 parts by weight, a viscosity of the composition considerably increases, thereby degrading physical properties of a thin film coating, and when the content of the dispersion resin is more than 80 parts by weight, the thermal conductivity and heat dissipation may be degraded, thereby also degrading electric conductivity.

In the composition of the present invention, the organic resin may be included at 30 to 60 parts by weight, and preferably 40 to 55 parts by weight, with respect to 100 parts by weight of the resin composition for surface treatment, to serve to uniformly disperse pigment materials enhancing thermal conductivity, heat dissipation and electric conductivity in the composition.

When the content of the organic resin is less than 30 parts by weight, an attachment strength to a surface of the steel sheet may be degraded, and it is difficult to form a uniform surface-treated layer, and when the content of the organic resin is more than 60 parts by weight, corrosion resistance may be degraded, workability may be degraded due to the increase in viscosity of the resin composition for surface treatment.

In the composition of the present invention, a specific kind of the organic resin is not particularly limited, but may be a water-soluble organic resin, and preferably at least one selected from the group consisting of a waterborne urethane resin, a waterborne acryl resin, a water-soluble epoxy resin, a water-soluble polyester resin, a water-soluble amino resin and a mixture thereof, more preferably at least one selected from the group consisting of a waterborne urethane resin having a carboxyl or hydroxyl group, a waterborne urethane resin modified with an acrylic monomer, a waterborne urethane resin modified with a vinyl-based monomer, a water-soluble acryl resin having a carboxyl or hydroxyl group and a mixture thereof, and further more preferably, a waterborne urethane resin using polycarbonate polyol.

In the composition of the present invention, the thermally conductive dispersing element may be included at 20 to 40 parts by weight, and preferably, 20 to 35 parts by weight, with respect to 100 parts by weight of the resin composition for surface treatment. When a content of the thermally conductive dispersing element is less than 20 parts by weight, corrosion resistance may be considerably degraded, and when the content of the thermally conductive dispersing element is more than 40 parts by weight, attachment strength to a surface of the steel sheet may be degraded, and it may be difficult to form a uniform surface-treated layer.

The resin composition for surface treatment of the present invention may further include at least one additive selected from the group consisting of an inorganic metal sol; a rust inhibitor; an organic metal complex; and a crosslinking agent.

In the composition of the present invention, the additive may be included at 10 to 60 parts by weight, preferably, 10 to 50 parts by weight, and more preferably 10 to 40 parts by weight with respect to 100 parts by weight of the resin composition for surface treatment.

Particularly, in the composition of the present invention, the inorganic metal sol may be included at 5 to 20 parts by weight with respect to 100 parts by weight of the composition for surface treatment and serve to provide corrosion resistance.

When a content of the inorganic metal sol is less than 5 parts by weight, corrosion resistance and electric conductivity may be degraded, when the content of the inorganic metal sol is more than 20 parts by weight, corrosion resistance and electric conductivity may not be further enhanced, and solution stability may be degraded.

In addition, in the composition of the present invention, a specific kind of the inorganic metal sol may be, but is not particularly limited to, at least one selected from the group consisting of silica sol, alumina sol, titania sol, zirconia sol, and a mixture thereof.

An average particle diameter of the inorganic metal sol may be, but is not particularly limited to, 5 to 30 nm, and preferably 5 to 20 nm. When the average particle diameter of the inorganic metal sol is less than 5 nm, durability may be degraded, and when the average particle diameter of the inorganic metal sol is more than 30 nm, a pore in-between the inorganic metal sol is formed, resin composition for surface treatment. Thus, the corrosion resistance may be degraded due to defects when the surface-treated layer is formed using a resin composition for surface treatment.

Particularly, in the composition of the present invention, the rust inhibitor may be included at 2 to 10 parts by weight with respect to 100 parts by weight of the composition for surface treatment, and serve to enhance corrosion resistance.

When a content of the rust inhibitor is less than 2 parts by weight, corrosion resistance may not be sufficiently enhanced, and when a content of the rust inhibitor is more than 10 parts by weight, the storage stability of the composition may be considerably degraded.

In addition, in the composition of the present invention, a specific kind of the rust inhibitor may be, but is not particularly limited to, a metal compound such as aluminum or aluminum phosphate; a phosphoric acid aqueous solution of hexaammonium heptamolybdate tetrahydrate; zinc; molybdenum; fluorine; boric acid; or a mixture or phosphate solution thereof.

Particularly, in the composition of the present invention, the organic metal complex may be included at 2 to 10 parts by weight with respect to 100 parts by weight of the resin composition for surface treatment, and serve to enhance a cohesive property between the steel sheet and the resin composition for surface treatment of the present invention. The organic metal complex may enhance a condensation reaction with the steel sheet, particularly, galvanized steel sheet, and a cohesive property by forming a hydrogen bond, thereby enhancing corrosion resistance of the steel sheet.

When the content of the organic metal complex is less than 2 parts by weight, the cohesive property to the steel sheet may not be sufficiently enhanced, and when the content of the organic metal complex is more than 10 parts by weight, the storage stability of the composition may be considerably degraded, and increase a production cost.

In addition, in the composition of the present invention, a specific kind of the organic metal complex may be, but is not particularly limited to, at least one selected from the group consisting of a silane-based coupling agent, a titanium-based coupling agent, a zirconium-based coupling agent, and a mixture thereof.

The silane-based coupling agent may be at least one selected from the group consisting of vinyltriethoxy silane, 2-glycidyloxypropyltrimethoxy silane, 3-glycidyloxypropylmethyldimethoxy silane, N-2-(aminoethyl)-3-aminopropyl-triethoxy silane, 4-aminopropyltriethoxy silane and a mixture thereof, the titanium-based coupling agent may be at least one selected from the group consisting of titanium acetyl acetonate, iso-butoxy titanium ethyl acetoacetate, tetra isopropyl titanate, tetra normal butyl titanate and a mixture thereof, and the zirconium-based coupling agent may be at least one selected from the group consisting of tetra normal-propyl zirconate, tetra normal-butyl zirconate, triethanol amine zirconate, hexafluoro zirconate and a mixture thereof, but the present invention is not limited thereto.

Particularly, in the composition of the present invention, the crosslinking agent may be included at 2 to 12 parts by weight with respect to 100 parts by weight of the resin composition for surface treatment, and serve to crosslink a water-soluble organic resin through crosslinking with a carboxyl or hydroxyl group included in the water-soluble organic resin of the composition of the present invention, thereby enhancing corrosion resistance.

When the content of the crosslinking agent is less than 2 parts by weight, it cannot serve' to crosslink the water-soluble organic resin, and when the content of the crosslinking agent is more than 12 parts by weight, it may be difficult to form a uniform surface-treated layer, thereby degrading corrosion resistance by a non-reacted crosslinking agent and increasing a production cost.

In addition, in the composition of the present invention, a specific kind of the crosslinking agent may be, but is not particularly limited to, at least one selected from the group consisting of a compound having a carbodiimide group, a melamine-based crosslinking agent, an isocyanate-based crosslinking agent, an aziridine-based crosslinking agent and a mixture thereof.

The melamine-based crosslinking agent may be, but is not limited to, at least one selected from the group consisting of a methoxy melamine resin, an ethoxy melamine resin, a propoxy melamine resin, a butoxy melamine resin and a pentoxy melamine resin.

The isocyanate-based crosslinking agent may be, but is not limited to, at least one selected from the group consisting of diphenylmethane-4,4'-diisocyanate, toluenediisocyanate, 4,4'-diphenyldimethylmethane diisocyanate, xylenediisocyanate, 1,5-naphthalene diisocyanate, isoporone diisocyanate, hexamethylene diisocyanate, isopropylene diisocyanate, methylene diisocyanate, trimethylhexamethylene diisocyanate, tolidine diisocyanate, methylcyclohexane diisocyanate, and a reaction product of one selected therefrom and a polyol.

The aziridine-based crosslinking agent may be, but is not limited to, at least one selected from the group consisting of N,N'-toluene-2,4-bis(1-aziridinecarboxamide), N,N'-diphenylmethane-4,4'-bis(1-aziridinecarboxamide), triethylene melamine, bisisoprothaloyl-1-(2-methylaziridine) and tri-1-aziridinyl phosphine oxide.

The resin composition for surface treatment of the present invention may further include at least one additive selected from the group consisting of an antifoaming agent, a lubrication-enhancing additive, a wax and an organic solvent, other than the above-described components. The content of the additive may be 0.1 to 5 parts by weight with respect to 100 parts by weight of the resin composition for surface treatment.

In addition, the resin composition for surface treatment of the present invention may further include at least one selected from the group consisting of water, ethanol and a mixture thereof as a solvent, and preferably, a mixture of water and ethanol, in which the ethanol is included at 0.1 to 10 wt % to enhance wettability and dispersibility of the resin composition for surface treatment of the present invention.

In the composition of the present invention, the content of the solvent may be suitably selected according to the contents of the above-described components without particular limitation.

Another aspect of the present invention provides a surface-treated steel sheet, which includes a steel sheet; and a surface-treated layer formed on one or both surfaces of the steel sheet and containing a cured product of the resin composition for surface treatment of the present invention.

Figure 2:
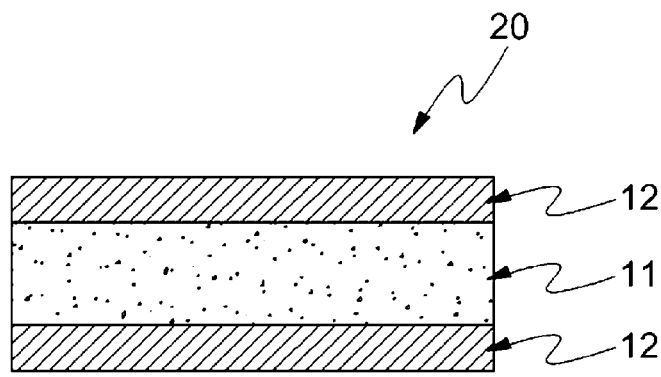
FIG. 2 is a cross-sectional view of a surface-treated steel sheet according to another exemplary embodiment of the present invention.

FIGS. 1 and 2 are cross-sectional views of a surface-treated steel sheet according to an exemplary embodiment of the present invention. As shown in FIG. 1, the steel sheet 10 of the present invention may include a steel sheet 11; and a surface-treated layer 12 formed on one surface of the steel sheet 11, and as shown in FIG. 2, the steel sheet 20 of the present invention may include a steel sheet 11; and two surface-treated layers 12 formed on both surfaces of the steel sheet 11.

In the surface-treated steel sheet of the present invention, a specific kind of the steel sheet may be, but is not particularly limited to, cold-rolled steel sheet; a cold-rolled steel sheet plated with at least one metal selected from the group consisting of zinc, aluminum, copper, nickel, a zinc-aluminum alloy, a zinc-nickel alloy, a zinc-iron alloy, a zinc-magnesium alloy, a zinc-aluminum-magnesium alloy; an electro galvanizing steel sheet; a stainless steel sheet; or a magnesium plate.

In the surface-treated steel sheet of the present invention, a thickness of the steel sheet is not particularly limited, and may be suitably selected according to a use of the steel sheet.

In the surface-treated steel sheet of the present invention, the surface-treated layer formed on one or both surfaces of the steel sheet may contain a cured product of the resin composition for surface treatment according to the present invention. Descriptions on the resin composition for surface treatment contained in the surface-treated layer are the same as described above.

In the surface-treated steel sheet of the present invention, a coating thickness after drying of the surface-treated layer may be, but is not particularly limited to, 0.5 to 3.5 µm. When the coating thickness after drying of the surface-treated layer is less than 0.5 µm, heat dissipation and corrosion resistance of the surface-treated steel sheet may be degraded, and when the coating thickness after drying of the surface-treated layer is more than 3.5 µm, surface electric conductivity of the surface-treated steel sheet may be considerably degraded. Corresponding to the coating thickness after drying of the surface-treated layer, a coating weight after drying may be 500 to 3,500 mg/m$^2$.

Still another aspect of the present invention provides a method of manufacturing a surface-treated steel sheet, which includes coating a resin composition for surface treatment according to the present invention on one or both surfaces of the steel sheet, and curing the coated resin composition for surface treatment.

The method of manufacturing a surface-treated steel sheet may include coating the resin composition for surface treatment according to the present invention on one or both surfaces of the coating steel sheet, and curing the coated resin composition for surface treatment. Descriptions on the steel sheet and the resin composition for surface treatment are the same as described above.

In the present invention, a method of coating the resin composition for surface treatment according to the present invention on the steel sheet is not particularly limited, and a means conventionally known in the art, for example, a bar coater or roll coater, may be used without limitation.

In the present invention, an operation of curing the coated resin composition for surface treatment may be performed at a peak metal temperature (PMT) of 150 to 240° C., and preferably 180 to 200° C. When the resin composition for surface treatment is cured at a PMT of less than 150° C., since the crosslinking of the water-soluble organic resin included in the composition is not sufficiently performed, corrosion resistance, alkali resistance and solvent resistance may be deteriorated, and when the resin composition for surface treatment is cured at a PMT of more than 240° C., a surface-treated layer is split by high heat, and thus corrosion resistance and workability may be deteriorated.

The surface-treated steel sheet manufactured by the method of manufacturing a surface-treated steel sheet of the present invention may not only have high whiteness, corrosion resistance, fingerprint resistance, workability, surface electric conductivity, and alkali resistance, but also have excellent heat dissipation.

Hereinafter, the present invention will be described in further detail with reference to Examples according to the present invention and Comparative Examples not according to the present invention. However, the scope of the present invention is not limited to the following Examples.

Example 1

(1) Manufacture of Resin Composition for Surface Treatment

A resin composition for surface treatment was prepared by mixing 40 parts by weight of a water-soluble polycarbonate polyol urethane resin (Alerdink U 933, Alberdingk Holey), 30 parts by weight of a thermally conductive dispersing element, 10 parts by weight of a silica sol (Snowtex-N, Nissin Chemical), 5 parts by weight of a zinc phosphate rust inhibitor (Halox 550, Halox), 10 parts by weight of an organic metal complex (Tyzor LA, Dupont), and 5 parts by weight of a melamine-based crosslinking agent (Cymel 325, Cytec). Here, the thermally conductive dispersing element was prepared by mixing 50 parts by weight of a silicon-containing compound, $Si_3N_4$ (SiciNide, Vesta Ceramics, average particle diameter 1 µm), and 50 parts by weight of an aluminum-containing compound, $Al_2O_3$ (Baikalox CR 100, Baikowi, average particle diameter 0.5 µm) with respect to 100 parts by weight of a solid content of the thermally conductive dispersing element, adding the mixture to 50 parts by weight of a dispersion resin, a water-soluble polycarbonate polyol urethane resin (Alerdink U 933, Alberdingk Boley) (based on 100 parts by weight of the solid content of the thermally conductive dispersing element), and dispersing the resulting mixture using a ring mill.

(2) Coating Steel Sheet with Resin Composition for Surface Treatment

The prepared resin composition for surface treatment was coated on an electro galvanizing steel plate (thickness of the steel plate: 1.0 mm) having a planar zinc coating weight of 20 g/m$^2$ using a roll coater to have a thickness after drying of 2 µm.

(3) Formation of Surface-Treated Layer

The resin composition for surface treatment coated on the electro galvanizing steel plate was cured at a PMT of 180° C., thereby forming a surface-treated layer to have a thickness of 2 µm. Thus, a surface-treated steel sheet having the surface-treated layer was completed.

Examples 2 to 19

(1) Preparation of Resin Composition for Surface Treatment

A resin composition for surface treatment was prepared by the method as described in Example 1, except that components and contents of the solid content of the thermally conductive dispersing element were changed as shown in Table 1.

(2) Coating of Steel Sheet with Resin Composition for Surface Treatment

A resin composition for surface treatment was coated on a steel sheet by the same method as described in Example 1.

(3) Formation of Surface-Treated Layer

A surface-treated steel sheet having a surface-treated layer was completed by the same method as described in Example 1.

Components and contents of solid contents of the thermally conductive dispersing elements prepared in Examples 1 to 19 are summarized and shown in Table 1.

TABLE 1

| Category | | A Kind | A Content | B Kind | B Content | C Kind | C Content | D Kind | D Content |
|---|---|---|---|---|---|---|---|---|---|
| Example | 1 | $Si_3N_4$ | 50 | $Al_2O_3$ | 50 | — | 0 | — | 0 |
| | 2 | $Si_3N_4$ | 40 | $Al_2O_3$ | 45 | CB | 5 | mica | 10 |
| | 3 | $Si_3N_4$ | 45 | Al2O3 | 45 | CB | 10 | mica | 0 |
| | 4 | $Si_3N_4$ | 45 | $Al_2O_3$ | 45 | CB | 5 | mica | 5 |
| | 5 | $Si_3N_4$ | 47.5 | $Al_2O_3$ | 47.5 | CB | 5 | mica | 0 |
| | 6 | $Si_3N_4$ | 35 | $Al_2O_3$ | 60 | CB | 0 | mica | 5 |
| | 7 | SiC | 50 | $Al_2O_3$ | 50 | CB | 0 | mica | 0 |
| | 8 | $Si_3N_4$ | 45 | AlN | 45 | CB | 5 | mica | 5 |
| | 9 | SiC | 45 | AlN | 45 | CB | 5 | mica | 5 |
| | 10 | SiC | 45 | $Al_2O_3$ | 45 | CB | 5 | mica | 5 |
| | 11 | SiC | 45 | $Al_2O_3$ | 45 | CNT | 5 | mica | 5 |
| | 12 | SiC | 45 | $Al_2O_3$ | 45 | Graphite | 5 | mica | 5 |
| | 13 | $Si_3N_4$ | 45 | AlN | 47.5 | Graphite | 0 | mica | 7.5 |
| | 14 | SiC | 45 | $Al_2O_3$ | 45 | CB | 10 | MgO | 0 |
| | 15 | SiC | 45 | $Al_2O_3$ | 45 | Graphite | 5 | MgO | 5 |
| | 16 | SiC | 49 | $Al_2O_3$ | 49 | CNT | 2 | Ge | 0 |
| | 17 | SiC | 48 | $Al_2O_3$ | 48 | CNT | 4 | mica | 0 |
| | 18 | SiC | 46.5 | $Al_2O_3$ | 46.5 | CNT | 2 | Ge | 5 |
| | 19 | SiC | 47.5 | $Al_2O_3$ | 47.5 | Graphite | 5 | kaolin | 0 |

A: silicon-containing compound
B: aluminum-containing compound
C: carbon-containing compound
D: compound having far infrared radiation ratio of 0.8 or more in a wavelength range of 5 to 20 μm
Content unit: parts by weight
$Si_3N_4$: SiciNide, Vesta Ceramics, average particle diameter (1.0 μm)
SiC: GC 10000, Fujimi, average particle diameter(0.7 μm)
$Al_2O_3$: Baikalox CR 100, Baikowik, average particle diameter(0.5 μm)
AlN: Accumet Materials, average particle diameter(3 μm)
CB: carbon black (Conductex 7055 Ultra, Colombia Chemicals, average particle diameter(0.05 μm)
CNT: carbon nanotube (multiwall carbon nanotube, SigmaAldrich, average particle diameter(0.05 μm)
Graphite: Platelet nanofibers, SigmaAldrich, average particle diameter(2.0 μm)
mica: micronized Mica 325, CMMP, average particle diameter(3.5 μm)
MgO: Junsei, average particle diameter(3 μm)
Ge: Ge 99%, Youngwon Germanium, average particle diameter(5 μm)
kaolin: KaMin 70C, Kamin LLC, average particle diameter(3.2 μm)

Comparative Examples 1 to 12

(1) Preparation of Resin Composition for Surface Treatment

A resin composition for surface treatment was prepared by the method as described in Example 1, except that components and contents of the solid content of the thermally conductive dispersing element were changed as shown in Table 2.

(2) Coating Steel Sheet with Resin Composition for Surface Treatment

A resin composition for surface treatment was coated on a steel sheet by the same method as described in Example 1.

(3) Formation of Surface-Treated Layer

A surface-treated steel sheet having a surface-treated layer was completed by the same method as described in Example 1.
Components and contents of solid contents of the thermally conductive dispersing elements prepared in Comparative Examples 1 to 12 are summarized and shown in Table 2.

TABLE 2

| Category | | A Kind | A Content | B Kind | B Content | C Kind | C Content | D Kind | D Content |
|---|---|---|---|---|---|---|---|---|---|
| Comparative Example | 1 | $Si_3N_4$ | 0 | $Al_2O_3$ | 0 | CB | 0 | mica | 0 |
| | 2 | $Si_3N_4$ | 100 | $Al_2O_3$ | 0 | CB | 0 | mica | 0 |

TABLE 2-continued

| Category | | A | | B | | C | | D | |
|---|---|---|---|---|---|---|---|---|---|
| | | Kind | Content | Kind | Content | Kind | Content | Kind | Content |
| | 3 | Si$_3$N$_4$ | 0 | Al$_2$O$_3$ | 100 | CB | 0 | mica | 0 |
| | 4 | Si$_3$N$_4$ | 0 | Al$_2$O$_3$ | 0 | CB | 100 | mica | 0 |
| | 5 | Si$_3$N$_4$ | 0 | Al$_2$O$_3$ | 0 | CB | 0 | mica | 100 |
| | 6 | Si$_3$N$_4$ | 20 | Al$_2$O$_3$ | 60 | CB | 10 | mica | 10 |
| | 7 | Si$_3$N$_4$ | 60 | Al$_2$O$_3$ | 20 | CB | 10 | mica | 10 |
| | 8 | Si$_3$N$_4$ | 80 | Al$_2$O$_3$ | 20 | CB | 0 | mica | 0 |
| | 9 | Si$_3$N$_4$ | 30 | Al$_2$O$_3$ | 60 | CB | 5 | mica | 5 |
| | 10 | Si$_3$N$_4$ | 80 | Al$_2$O$_3$ | 20 | CNT | 0 | mica | 0 |
| | 11 | Si$_3$N$_4$ | 80 | AlN | 20 | CB | 0 | Ge | 0 |
| | 12 | SiC | 80 | Al$_2$O$_3$ | 20 | Graphite | 0 | mica | 0 |

A: silicon-containing compound
B: aluminum-containing compound
C: carbon-containing compound
D: compound having far infrared radiation ratio of 0.8 or more in a wavelength range of 5 to 20 μm
Content unit: parts by weight
Si$_3$N$_4$: SiciNide, Vesta Ceramics, average particle diameter(1.0 μm)
SiC: GC 10000, Fujimi, average particle diameter(0.7 μm)
Al$_2$O$_3$: Baikalox CR 100, Baikowik, average particle diameter(0.5 μm)
AlN: Accumet Materials, average particle diameter(3 μm)
CB: carbon black (Conductex 7055 Ultra, Colombia Chemicals), average particle diameter(0.05 μm)
CNT: carbon nanotube (multiwall carbon nanotube, SigmaAldrich, average particle diameter(20~50 nm)
Graphite: Platelet nanofibers, SigmaAldrich, average particle diameter(0.5~5.0 μm)
mica: micronized Mica 325, CMMP, average particle diameter(3.5 μm)
Ge: Ge99%, Youngwon Germanium, average particle diameter(5 μm)

Examples 20 to 23 and Comparative Examples 13 to 17

(1) Preparation of Resin Composition for Surface Treatment

A resin composition for surface treatment was prepared by the method as described in Example 4, except that components and contents of the solid content of the thermally conductive dispersing element were changed as shown in Table 3.

(2) Coating Steel Sheet with Resin Composition for Surface Treatment

A resin composition for surface treatment was coated on a steel sheet by the same method as described in Example 4.

(3) Formation of Surface-Treated Layer

A surface-treated steel sheet having a surface-treated layer was completed by the same method as shown in Example 4.

Components and contents of solid contents of the thermally conductive dispersing elements prepared in Examples 20 to 23 and Comparative Examples 13 to 17 are summarized and shown in Table 3.

TABLE 3

| Category | | A | | B | | C | | D | |
|---|---|---|---|---|---|---|---|---|---|
| | | Kind | Size | Kind | Size | Kind | Size | Kind | Size |
| Example | 20 | SiC | 0.7 | Al$_2$O$_3$ | 0.5 | CB | 0.5 | mica | 3.5 |
| | 21 | SiC | 0.7 | AlN | 3.0 | CB | 0.5 | mica | 3.5 |
| | 22 | SiC | 0.7 | Al$_2$O$_3$ | 0.5 | Graphite | 2.0 | MgO | 3.0 |
| | 23 | SiC | 4.5 | Al$_2$O$_3$ | 0.5 | Graphite | 2.0 | Ge | 5.0 |
| Comparative Example | 13 | Si$_3$N$_4$ | 3.0 | Al$_2$O$_3$ | 6.0 | CB | 0.05 | mica | 3.5 |
| | 14 | Si$_3$N$_4$ | 1.0 | Al$_2$O$_3$ | 0.5 | CB | 0.5 | mica | 35.0 |
| | 15 | Si$_3$N$_4$ | 5.2 | Al$_2$O$_3$ | 0.5 | CB | 0.5 | mica | 3.5 |

TABLE 3-continued

| Category | A Kind | A Size | B Kind | B Size | C Kind | C Size | D Kind | D Size |
|---|---|---|---|---|---|---|---|---|
| 16 | Si$_3$N$_4$ | 1.0 | Al$_2$O$_3$ | 6.0 | CNT | 10.0 | mica | 3.5 |
| 17 | SiC | 0.7 | AlN | 3.0 | CNT | 10.0 | mica | 3.5 |

A: silicon-containing compound
B: aluminum-containing compound
C: carbon-containing compound
D: compound having far infrared radiation ratio of 0.8 or more in a wavelength range of 5 to 20 μm
Size unit: μm
Si$_3$N$_4$: SiciNide(Vesta Ceramics), β-Silicon Nitride(ENO Materials)
SiC: GC 10000(Fujimi), Silicon Carbide(Donggwang Polishing)
Al$_2$O$_3$: Baikalox CR 100(Baikowik), Baikalox A125(Baikowik)
AlN: Accumet Materials
CB: carbon black (Conductex 7055 Ultra, Colombia Chemicals)
CNT: carbon nanotube (multiwall carbon nanotube, SigmaAldrich)
Graphite: Platelet nanofibers(SigmaAldrich)
mica: micronized Mica 325(CMMP) SM325W (Seogyung CMT)
MgO: magnesium oxide (Junsei)
Ge: Ge99%(Youngwon Germanium)

Example 24

(1) Preparation of Resin Composition for Surface Treatment

A resin composition for surface treatment was prepared by mixing 30 parts by weight of a water-soluble polycarbonate polyol urethane resin (Alerdink U 933, Alberdingk Boley), 20 parts by weight of a thermally conductive dispersing element, 15 parts by weight of a silica sol (Snowtex-N, Nissin Chemical), 10 parts by weight of a zinc phosphate rust inhibitor (Halox 550, Halox), 5 parts by weight of an organic metal complex (Tyzor LA, Dupont) and 5 parts by weight of a melamine-based crosslinking agent (Cymel 325, Cytec) with 15 parts by weight of a mixture of water and ethanol (97 wt % of water and 3 wt % of ethanol) as a solvent. Here, the thermally conductive dispersing element was prepared by mixing 45 parts by weight of a silicon-containing compound, SiC (GC 10000, Fujimi, average particle diameter 0.7 μm) and 45 parts by weight of an aluminum-containing compound, Al$_2$O$_3$ (Baikalox CR100, Baikowik, average particle diameter 0.5 μm), 5 parts by weight of a carbon-containing compound, carbon black (Platelet nanofibers, SigmaAldrich, average particle diameter 0.5 μm) and 5 parts by weight of a material having a far infrared radiation ratio of 0.8 or more, mica (Micronized Mica325, CMMP, average particle diameter 3.5 μm) with respect to 100 parts by weight of a solid content of the thermally conductive dispersing element, adding the mixture to 50 parts by weight (based on 100 parts by weight or the solid content of the thermally conductive dispersing element) of a water-soluble polycarbonate polyol urethane resin (Alerdink U 933, Alberdingk Boley) as a dispersion resin, and dispersing the resulting mixture using a ring mill.

(2) Coating Steel Sheet with Resin Composition for Surface Treatment

The prepared resin composition for surface treatment was coated on an electro galvanizing steel plate (thickness of the steel plate: 1.0 mm) having a planar zinc coating weight of 20 g/m$^2$ using a roll coater to have a thickness after drying of 2 μm.

(3) Formation of Surface-Treated Layer

A surface-treated layer was formed to have a thickness of 2 μm by curing the resin composition for surface treatment coated on the electro galvanizing steel plate at a PMT of 200° C. Thus, a surface-treated steel plate having a surface-treated layer was completed.

Examples 25 to 29 and Comparative Examples 18 to 25

(1) Preparation of Resin Composition for Surface Treatment

A resin composition for surface treatment was prepared by the method as described in Example 24, except that contents of a water-soluble organic resin, a thermally conductive dispersing element, an inorganic metal sol, a rust inhibitor, an organic metal complex and a crosslinking agent were changed as shown in Table 4.

(2) Coating Steel Sheet with Resin Composition for Surface Treatment

A resin composition for surface treatment was coated on a steel sheet by the same method as described in Example 24.

(3) Formation of Surface-Treated Layer

A surface-treated steel sheet having a surface-treated layer was completed by the same method as described in Example 24.

Compositions and contents of the resin compositions for surface treatment prepared in Examples 24 to 29 and Comparative Examples 18 to 25 are summarized and shown in Table 4.

TABLE 4

| Category | | Content of composition | | | | | | |
|---|---|---|---|---|---|---|---|---|
| | | Organic resin | Thermally conductive dispersing element | Inorganic metal sol | Rust inhibitor | Organic metal complex | Crosslinking agent | Solvent |
| Example | 24 | 30 | 20 | 15 | 10 | 5 | 5 | 15 |
| | 25 | 50 | 35 | 5 | 2 | 2 | 2 | 4 |
| | 26 | 60 | 20 | 10 | 5 | 2 | 2 | 1 |
| | 27 | 45 | 30 | 5 | 5 | 5 | 5 | 5 |
| | 28 | 45 | 30 | 5 | 5 | 5 | 10 | 0 |
| | 29 | 30 | 40 | 10 | 5 | 5 | 5 | 5 |
| Comparative Example | 18 | 20 | 30 | 10 | 5 | 3 | 12 | 20 |
| | 19 | 80 | 10 | 5 | 2 | 2 | 1 | 0 |
| | 20 | 40 | 30 | 0 | 10 | 5 | 12 | 3 |
| | 21 | 45 | 30 | 5 | 0 | 5 | 5 | 10 |
| | 22 | 45 | 30 | 5 | 5 | 0 | 5 | 10 |
| | 23 | 45 | 30 | 5 | 5 | 5 | 0 | 10 |
| | 24 | 60 | 0 | 20 | 10 | 5 | 5 | 0 |
| | 25 | 30 | 45 | 5 | 5 | 5 | 5 | 5 |

Content unit: parts by weight

Examples 30 to 35

(1) Preparation of Resin Composition for Surface Treatment

A resin composition for surface treatment was prepared by the same method as described in Example 27.

(2) Coating Steel Sheet with Resin Composition for Surface Treatment

A resin composition for surface treatment was coated on a steel sheet by the same method as described in Example 27, except that a range of thickness after drying of a surface-treated layer was changed as shown in Table 5.

(3) Formation of Surface-Treated Layer

A surface-treated steel sheet having a surface-treated layer was completed by the same method as described in Example 27, except that a curing temperature of the resin composition for surface treatment was changed as shown in Table 5.

Thicknesses and curing temperatures (PMT temperatures) of surface-treated layers of the surface-treated steel sheets manufactured in Examples 30 to 35 are summarized and shown in Table 5.

TABLE 5

| Category | | Thickness of surface-treated layer (μm) | Curing temperature (PMT temperature, ° C.) |
|---|---|---|---|
| Example | 30 | 0.5 | 180 |
| | 31 | 1.5 | 180 |
| | 32 | 3.5 | 180 |
| | 33 | 2.5 | 150 |
| | 34 | 0.5 | 220 |
| | 35 | 3.5 | 220 |

Comparative Examples 26 to 41

(1) Preparation of Resin Composition for Surface Treatment

A resin composition for surface treatment was prepared by the same method as described in Example 27.

(2) Coating Steel Sheet with Resin Composition for Surface Treatment

A steel sheet was coated with a resin composition for surface treatment by the same method as described in Example 27, except that a range of a thickness after drying of a surface-treated layer was changed as shown in Table 6.

(3) Formation of Surface-Treated Layer

A surface-treated steel sheet having a surface-treated layer was completed by the same method as described in Example 27, except that a curing temperature of the resin composition for surface treatment was changed as shown in Table 6.

Thicknesses and curing temperatures (PMT temperatures) of surface-treated layers of the surface-treated steel sheets manufactured in Comparative Examples 26 to 41 are summarized and shown in Table 6.

TABLE 6

| Category | | Thickness of surface-treated layer (μm) | Curing temperature (PMT temperature, ° C.) |
|---|---|---|---|
| Comparative Example | 26 | 5.0 | 180 |
| | 27 | 0.3 | 100 |
| | 28 | 0.5 | 100 |
| | 29 | 1.5 | 100 |
| | 30 | 3.5 | 100 |
| | 31 | 5.0 | 100 |
| | 32 | 7.0 | 100 |
| | 33 | 0.3 | 180 |
| | 34 | 7.0 | 180 |
| | 35 | 5.0 | 220 |
| | 36 | 0.3 | 250 |
| | 37 | 0.5 | 250 |
| | 38 | 1.5 | 250 |
| | 39 | 3.5 | 250 |
| | 40 | 5.0 | 250 |
| | 41 | 7.0 | 250 |

Physical properties were measured with respect to the surface-treated steel sheets manufactured in Examples and Comparative Examples.

1. Measurement of Heat Dissipation

Figure 3:
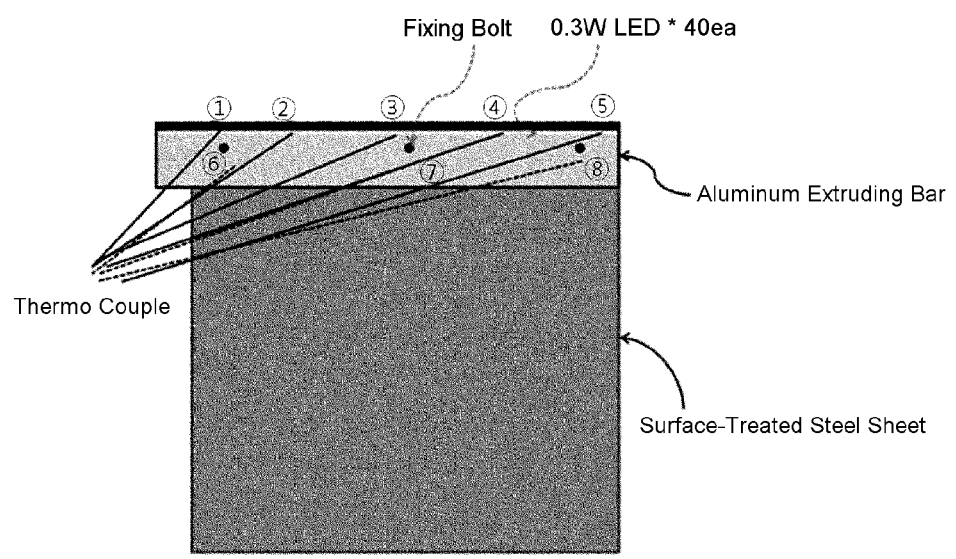
FIG. 3 is a schematic view of evaluating heat dissipation by measuring a temperature of the surface-treated steel sheets manufactured in Examples and Comparative Examples using a device for evaluating a heat dissipating temperature.

As shown in FIG. 3, temperatures of the surface-treated steel sheets manufactured in Examples and Comparative Examples were measured using a radiated heat temperature evaluating device. Specifically, temperatures of the surface-treated steel sheets were measured at 6, 7 and 8 positions of an aluminum extruding bar shown in FIG. 3, thereby examining how much the average value is lower than a temperature of an LED module, and evaluating heat dissipation according to the following evaluation criteria.

<Criteria for Evaluating Heat Dissipation>

○: an average temperature was −3° C. or more with respect to the temperature of the LED module Δ: an average temperature was less than −3° C. and −1 C or more with respect to the temperature of the LED module x: an average temperature was less than −1° C. with respect to the temperature of the LED module 2. Measurement of Electric Conductivity Surface resistances of the surface-treated steel sheets manufactured in Examples and Comparative Examples were measured using a surface resistance measuring device (Loresta GP, Mitsubishi Chemical), and surface electric conductivity was evaluated according to the following evaluation criteria.

<Criteria for Evaluating Electric Conductivity>

○: surface resistance of surface-treated steel sheet is 0.1 mΩ or less

Δ: surface resistance of surface-treated steel sheet is more than 0.1 mΩ and 1.0 mΩ or less x: surface resistance of surface-treated steel sheet is more than 1.0 mΩ

3. Measurement of Whiteness

Whiteness values (L coordination values) of the surface-treated steel sheets manufactured in Examples and Comparative Examples were measured using a Lab color-difference meter (ColorEye XTI-1, GretagMacbeth), and thus the whiteness was evaluated according to the following evaluation criteria.

<Criteria for Evaluating Whiteness>

○: the L coordination value of the surface-treated steel sheet was 60 or more x: the L coordination value of the surface-treated steel sheet was less than 60

4. Measurement of Solution Stability

Right after the resin compositions for surface treatment were prepared according to Examples and Comparative Examples, initial viscosity (Vi) was measured and cooled to 25° C. and later viscosity (Vl) was measured at 25° C. to be assigned to General Example 1, resulting in evaluation according to the following evaluation criteria.

$$\Delta V = (Vl - Vi)/Vi \times 100(\%)$$ [General Formula 1]

<Criteria for Evaluating Solution Stability>

○: ΔV was less than 20(%), or gelation was not seen with naked eyes x: ΔV was 20(%) or more, or gelation was seen with naked eyes 5. Measurement of Corrosion Resistance The surface-treated steel sheets manufactured in Examples and Comparative Examples were cut to a size of 30 cm×30 cm (width×length) to manufacture specimens, salted water having a concentration of 5% and a temperature of 35° C. was sprayed onto a planar plate of each specimen at a spray pressure of 1 kg/cm², and after 72 hours, a white rust (corrosion) area formed on the surface-treated steel sheet was measured.

<Criteria for Evaluating Corrosion Resistance>

○: an area of white rust was less than 5% of the total area

Δ: an area of white rust was 5 to 10% of the total area x: an area of white rust was more than 10% of the total area 6. Measurement of Alkali Resistance An aqueous solution (concentration of a decreasing agent: 2%) in which a degreasing agent (FC-L4460, Nihon Parkerizing) was dissolved was maintained at 60° C., the surface-treated steel sheets manufactured in Examples and Comparative Examples were dipped in the aqueous solutions for 2 minutes, washed with running water, and dried. Subsequently, color differences (ΔE) before and after degreasing of the surface-treated steel sheet were measured.

<Criteria for Evaluating Alkali Resistance>

○: the color difference of the surface-treated steel sheet was 1 or less x: the color difference of the surface-treated steel sheet was more than 1

7. Measurement of Workability

The surface-treated steel sheets manufactured in Examples and Comparative Examples were cut to a size of 150 cm×75 cm (width×length), thereby preparing specimens. Lines were drawn horizontally and vertically to form 100 grids having a gap of 1 mm on a surface of the specimen using a cross cut guide, the part having the 100 grids was lifted to a height of 6 mm using an erichsen tester, and a peelable tape (NB-1, Ichiban) was attached to the lifted part and then detached, thereby observing that whether the erichsen part is peeled or not.

<Criteria for Evaluating Workability>

○: there was not surface peeling

Δ: 1 to 3 surface peelings were observed from 100 specimens x: more than 3 surface peeling were observed from 100 specimens Results of measuring physical properties for the surface-treated steel sheets manufactured in Examples 1 to 19 and Comparative Examples 1 to 12 are shown in Tables 7 and 8.

TABLE 7

| Category | | Heat dissipation | Electric conductivity | Whiteness | Solution stability |
|---|---|---|---|---|---|
| Example | 1 | ○ | ○ | ○ | ○ |
| | 2 | ○ | ○ | ○ | ○ |
| | 3 | ○ | ○ | ○ | ○ |
| | 4 | ○ | ○ | ○ | ○ |
| | 5 | ○ | ○ | ○ | ○ |
| | 6 | ○ | ○ | ○ | ○ |
| | 7 | ○ | ○ | ○ | ○ |
| | 8 | ○ | ○ | ○ | ○ |
| | 9 | ○ | ○ | ○ | ○ |
| | 10 | ○ | ○ | ○ | ○ |
| | 11 | ○ | ○ | ○ | ○ |
| | 12 | ○ | ○ | ○ | ○ |
| | 13 | ○ | ○ | ○ | ○ |
| | 14 | ○ | ○ | ○ | ○ |
| | 15 | ○ | ○ | ○ | ○ |
| | 16 | ○ | ○ | ○ | ○ |
| | 17 | ○ | ○ | ○ | ○ |
| | 18 | ○ | ○ | ○ | ○ |
| | 19 | ○ | ○ | ○ | ○ |

○: excellent
x: poor

TABLE 8

| Category | | Heat dissipation | Electric conductivity | Whiteness | Solution stability |
|---|---|---|---|---|---|
| Comparative Example | 1 | — | x | ○ | ○ |
| | 2 | ○ | ○ | x | x |
| | 3 | ○ | x | ○ | x |
| | 4 | ○ | x | x | x |
| | 5 | x | x | ○ | x |
| | 6 | x | ○ | ○ | ○ |
| | 7 | x | x | ○ | ○ |
| | 8 | x | ○ | x | x |

TABLE 8-continued

| Category | | Heat dissipation | Electric conductivity | Whiteness | Solution stability |
|---|---|---|---|---|---|
| | 9 | x | o | o | o |
| | 10 | x | o | x | x |
| | 11 | x | o | x | x |
| | 12 | x | o | x | x | o: excellent
x: poor

As shown in Tables 7 and 8, in case of Examples 1 to 19 according to the present invention, with respect to 100 parts by weight of the solid content of the thermally conductive dispersing element, contents of the silicon-containing compound and the aluminum-containing compound were in the range of 35 to 65 parts by weight, and thus it was confirmed that they had excellent heat dissipation as well as excellent electric conductivity, whiteness, and solution stability.

Meanwhile, in case of Comparative Examples 1 to 12 not according to the present invention, with respect to 100 parts by weight of the solid content of the thermally conductive dispersing element, the content of the silicon-containing compound or the aluminum-containing compound was beyond a specific content range in the present invention, and thus it was confirmed that at least one of the physical properties including heat dissipation, electric conductivity, whiteness and solution stability were poor.

Accordingly, in the resin composition for surface treatment of the present invention, as the contents of the silicon-containing compound and the aluminum-containing compound included in the thermally conductive dispersing element were controlled within the range of 35 to 65 parts by weight with respect to 100 parts by weight of the solid content of the thermally conductive dispersing element, it was confirmed that it had excellent heat dissipation, as well as excellent electric conductivity, whiteness and solution stability.

Results of measuring physical properties for the surface-treated steel sheets manufactured in Examples 20 to 23 and Comparative Examples 13 to 17 are shown in Table 9.

TABLE 9

| Category | | Heat dissipation | Workability | Corrosion resistance | Alkali resistance |
|---|---|---|---|---|---|
| Example | 20 | o | o | o | o |
| | 21 | o | o | o | o |
| | 22 | o | o | o | o |
| | 23 | o | o | o | o |

TABLE 9-continued

| Category | | Heat dissipation | Workability | Corrosion resistance | Alkali resistance |
|---|---|---|---|---|---|
| Comparative Example | 13 | x | o | x | o |
| | 14 | x | x | x | o |
| | 15 | x | x | x | x |
| | 16 | x | o | x | x |
| | 17 | x | x | x | x | o: excellent
x: poor

As shown in Table 9, in case of Examples 20 to 23 according to the present invention, since the silicon-containing compound, the aluminum-containing compound, the carbon-containing compound and the compound having a far infrared radiation rate of 0.8 or more included in the thermally conductive dispersing element had average particle diameters of 5 μm or less, 3 μm or less, 5 μm or less and 5 μm or less, respectively, it was confirmed that the surface-treated steel sheet had excellent heat dissipation, as well as excellent workability, corrosion resistance and alkali resistance.

Meanwhile, in case of Comparative Example 13 to 17 not according to the present invention, since at least one of the average particle diameter of the silicon-containing compound, the aluminum-containing compound, the carbon-containing compound and the compound having a far infrared radiation rate of 0.8 or more included in the thermally conductive dispersing element was beyond a specific range of the average particle diameter, it was confirmed that at least two of the physical properties including heat dissipation, workability, corrosion resistance and alkali resistance were poor.

Accordingly, in the resin composition for surface treatment of the present invention, as the average particle diameters of the silicon-containing compound, the aluminum-containing compound, the carbon-containing compound and the compound having a far infrared radiation rate of 0.8 or more included in the thermally conductive dispersing element were controlled within the range of 5 μm or less, 3 μm or less, 5 μm or less and 5 μm or less, respectively, it was confirmed that the surface-treated steel sheet had excellent heat dissipation, as well as excellent workability, corrosion resistance and alkali resistance.

Results of measuring physical properties for the surface-treated steel sheets manufactured in Examples 24 to 29 and Comparative Examples 18 to 25 are shown in Table 10.

TABLE 10

| Category | | Heat dissipation | Electric conductivity | Whiteness | Workability | Corrosion resistance | Alkali resistance |
|---|---|---|---|---|---|---|---|
| Example | 24 | o | o | o | o | o | o |
| | 25 | o | o | o | o | o | o |
| | 26 | o | o | o | o | o | o |
| | 27 | o | o | o | o | o | o |
| | 28 | o | o | o | o | o | o |
| | 29 | o | o | o | o | o | o |
| Comparative Example | 18 | o | o | o | x | x | o |
| | 19 | x | x | o | o | x | o |
| | 20 | o | o | o | x | o | x |
| | 21 | o | o | o | o | x | o |
| | 22 | o | o | o | x | o | x |
| | 23 | o | o | o | x | x | x |
| | 24 | x | x | o | o | o | o |
| | 25 | o | o | x | o | o | o | o: excellent
x: poor

As shown in Table 10, in case of Examples 24 to 29 according to the present invention, the contents of the water-soluble organic resin, the thermally conductive dispersing element, the inorganic metal sol, the rust inhibitor, the organic metal complex and the crosslinking agent included in the resin composition for surface treatment were in the ranges of 30 to 60 parts by weight, 20 to 40 parts by weight, 5 to 20 parts by weight, 2 to 10 parts by weight, 2 to 10 parts by weight and 2 to 12 parts by weight with respect to 100 parts by weight of the resin composition for surface treatment, it was confirmed that the surface-treated steel sheet had excellent heat dissipation, as well as excellent workability, corrosion resistance and alkali resistance.

Meanwhile, in case of Comparative Example 18 to 25 not according to the present invention, since at least one of the contents of the water-soluble organic resin, the thermally conductive dispersing element, the inorganic metal sol, the rust inhibitor, the organic metal complex and the crosslinking agent included in the resin composition for surface treatment was beyond a specific content range, it was confirmed that at least one of the physical properties including heat dissipation, electric conductivity, whiteness, workability, corrosion resistance and alkali resistance were poor.

Accordingly, the contents of the water-soluble organic resin, the thermally conductive dispersing element, the inorganic metal sol, the rust inhibitor, the organic metal complex and the crosslinking agent included in the resin composition for surface treatment were controlled within the ranges of 30 to 60 parts by weight, 20 to 40 parts by weight, 5 to 20 parts by weight, 2 to 10 parts by weight, 2 to 10 parts by weight and 2 to 12 parts by weight with respect to 100 parts by weight of the resin composition for surface treatment, it was confirmed that the surface-treated steel sheet had excellent heat dissipation, as well as excellent electric conductivity, whiteness, workability, corrosion resistance and alkali resistance.

Results of measuring physical properties for the surface-treated steel sheets manufactured in Examples 30 to 35 and Comparative Examples 26 to 41 are shown in Tables 11 and 12.

TABLE 11

| Category | | Heat dissipation | Electric conductivity | Corrosion resistance | Workability |
|---|---|---|---|---|---|
| Example | 30 | ○ | ○ | ○ | ○ |
| | 31 | ○ | ○ | ○ | ○ |
| | 32 | ○ | ○ | ○ | ○ |
| | 33 | ○ | ○ | ○ | ○ |
| | 34 | ○ | ○ | ○ | ○ |
| | 35 | ○ | ○ | ○ | ○ |

○: excellent
x: poor

TABLE 12

| Category | | Heat dissipation | Electric conductivity | Corrosion resistance | Workability |
|---|---|---|---|---|---|
| Comparative Example | 26 | ○ | x | ○ | ○ |
| | 27 | x | x | x | x |
| | 28 | Δ | Δ | x | x |
| | 29 | Δ | Δ | Δ | x |
| | 30 | Δ | Δ | Δ | x |
| | 31 | Δ | x | Δ | x |
| | 32 | Δ | x | Δ | Δ |
| | 33 | x | ○ | ○ | x |
| | 34 | ○ | x | ○ | Δ |
| | 35 | ○ | x | ○ | ○ |
| | 36 | x | x | Δ | x |
| | 37 | ○ | ○ | Δ | Δ |
| | 38 | ○ | ○ | Δ | x |
| | 39 | ○ | ○ | Δ | x |
| | 40 | ○ | x | Δ | x |
| | 41 | ○ | x | x | x |

○: excellent
Δ: moderate
x: poor

As shown in Tables 11 and 12, in case of Examples 30 to 35 according to the present invention, in the manufacture of the surface-treated steel sheet, the coating thickness and curing temperature (PMT temperature) of the surface-treated layer were within temperature ranges of 0.5 to 3.5 μm and 150 to 240° C., respectively, and thus it was confirmed that the surface-treated steel sheet had excellent electric conductivity, corrosion resistance, workability and heat dissipation.

Meanwhile, in case of Comparative Examples 26 to 41 not according to the present invention, in the manufacture of the surface-treated steel sheet, the coating thickness and curing temperature (PMT temperature) of the surface-treated layer were beyond a specific range in the present invention, and thus it was confirmed that at least one of physical properties including heat dissipation, electric conductivity, corrosion resistance and workability was poor.

Accordingly, in the method of manufacturing a surface-treated steel sheet of the present invention, as the coating thickness and curing temperature (PMT temperature) of the surface-treated layer were within temperature ranges of 0.5 to 3.5 μm and 150 to 240° C., respectively, it was confirmed that the surface-treated steel sheet having excellent electric conductivity, corrosion resistance, workability and heat dissipation could be manufactured.

DESCRIPTION OF REFERENCE MARKS

10, 20: surface-treated steel sheet
11: steel sheet
12: surface-treated layer
①,②,③,④,⑤: position of measuring temperature of LED module
⑥,⑦,⑧: position of fixing bolt Since a steel sheet coated with the resin composition for surface treatment of the present invention has excellent physical properties including heat dissipation, electric conductivity and whiteness, it is used instead of a bottom edge of a backlight unit, and particularly, an edge-type backlight unit, and thus a production cost of the flat panel display device can be reduced.

While the invention has been shown and described with reference to certain exemplary embodiments thereof, it will be understood by those skilled in the art that various modifications in form and details may be made therein without departing from the spirit and scope of the invention as defined by the appended claims.

The invention claimed is:

1. A resin composition for surface treatment, comprising:
an organic resin at 30 to 60 parts by weight with respect to 100 parts by weight of the resin composition for surface treatment;
a thermally conductive dispersing element at 20 to 40 parts by weight with respect to 100 parts by weight of the resin composition for surface treatment;
an inorganic metal sol at 5 to 20 parts by weight with respect to 100 parts by weight of the resin composition for surface treatment;

a rust inhibitor at 2 to 10 parts by weight with respect to 100 parts by weight of the resin composition for surface treatment;

an organic metal complex at 2 to 10 parts by weight with respect to 100 parts by weight of the resin composition for surface treatment; and a crosslinking agent at 2 to 12 parts by weight; with respect to 100 parts by weight of the resin composition for surface treatment, wherein the thermally conductive dispersing element includes, with respect to 100 parts by weight of a solid content of the thermally conductive dispersing element; a silicon-containing compound at 35 to 65 parts by weight; an aluminum-containing compound at 35 to 65 parts by weight; a carbon-containing compound at 10 parts by weight or less; a compound having a far infrared radiation rate of 0.8 or more in a wavelength range of 5 to 20 μm at 10 parts by weight or less; and a dispersion resin at 20 to 80 parts by weight, wherein the silicon-containing compound has an average particle diameter of 5 μm or less, wherein the silicon-containing compound is at least one selected from the group consisting of silicon (Si), silicon carbide (SiC), and silicon nitride ($Si_3N_4$), wherein the aluminum-containing compound has an average particle diameter of 3 μm or less, wherein the aluminum-containing compound is at least one selected from the group consisting of aluminum oxide, aluminum nitride (AlN), and an aluminum powder, wherein the carbon-containing compound has an average particle diameter or a length of a major axis of 5 μm or less, wherein the carbon-containing compound is at least one selected from the group consisting of a carbon nanotube, a carbon fiber, a carbon black, a graphite and a graphene, wherein the compound having a far infrared radiation rate of 0.8 or more in a wavelength range of 5 to 20 μm has an average particle diameter of 5 μm or less, wherein the compound having a far infrared radiation rate of 0.8 or more in a wavelength range of 5 to 20 μm is at least one selected from the group consisting of magnesium (Mg), magnesium oxide (MgO), titanium dioxide ($TiO_2$), sericitea, mica, tourmaline, biotite, illite, kaolin, bentonite, quartz porphyry, gneisses, ceramic powder, germanium (Ge), germanium dioxide ($GeO_2$) and germanium 132 (Ge-132), wherein the dispersion resin included in the thermally conductive dispersing element is at least one selected from the group consisting of a waterborne urethane resin, a waterborne acryl resin, a water-soluble epoxy resin, a water-soluble polyester resin, a water-soluble amino resin and a mixture thereof, and wherein the organic resin is at least one selected from the group consisting of a waterborne urethane resin, a waterborne acryl resin, a water-soluble epoxy resin, a water-soluble polyester resin, a water-soluble amino resin and a mixture thereof.

2. A surface-treated steel sheet, comprising:

a steel sheet; and a surface-treated layer formed on one or both surfaces of the steel sheet and containing a cured product of the resin composition for surface treatment of claim 1.

3. The surface-treated steel sheet according to claim 2, wherein a thickness of a coating film after drying of the surface-treated layer is 0.5 to 3.5 μm.

* * * * *